United States Patent [19]

Sakuragi

[11] Patent Number: 5,768,177
[45] Date of Patent: Jun. 16, 1998

[54] CONTROLLED DELAY CIRCUIT FOR USE IN SYNCHRONIZED SEMICONDUCTOR MEMORY

[75] Inventor: Shinji Sakuragi, Tokyo, Japan

[73] Assignee: NEC Corporation, Tokyo, Japan

[21] Appl. No.: 855,535

[22] Filed: May 13, 1997

[30] Foreign Application Priority Data

May 13, 1996 [JP] Japan ................................ 8-142242

[51] Int. Cl.$^6$ ........................................... H03H 11/26
[52] U.S. Cl. ................. 365/194; 365/189.05; 327/276; 327/278; 327/158; 327/161
[58] Field of Search ........................ 365/194, 189.05, 365/191; 327/276, 278, 277, 153, 158, 149, 161

[56] References Cited

U.S. PATENT DOCUMENTS 5,570,294  10/1996  McMinn et al. ................ 327/276
5,668,491   9/1997  Higashisaka et al. ........... 327/277

*Primary Examiner*—Vu A. Le
*Attorney, Agent, or Firm*—Sughrue, Mion, Zinn, Macpeak & Seas, PLLC

[57] ABSTRACT

A controlled delay circuit for use in a synchronized semiconductor memory, comprises a reference delay, a delay circuit for controlling an internal circuit, and a comparing and adjusting circuitry comparing a delay amount of the reference delay with a cycle of an external synchronous signal, at a mode register setting time, for automatically adjusting a delay time of the delay circuit on the basis of the result of the comparison.

4 Claims, 8 Drawing Sheets

DESIGNED DELAY VALUE ≒ ACTUAL DELAY VALUE

TG₂ ON

DESIGNED DELAY VALUE < ACTUAL DELAY VALUE

TG₁ ON

DESIGNED DELAY VALUE > ACTUAL DELAY VALUE

TG₃ ON

CONTROLLED DELAY CIRCUIT FOR USE IN SYNCHRONIZED SEMICONDUCTOR MEMORY

BACKGROUND OF THE INVENTION

1. Field of the Invention

The present invention relates to a synchronized semiconductor memory, and more specifically to a controlled delay circuit for use in a synchronized semiconductor memory in which an internal circuit operates in synchronism with an external clock.

2. Description of Related Art

Referring to FIG. 1, there is shown a block diagram of a basic circuit construction of a conventional synchronized semiconductor memory. In the semiconductor memory, generally, control of an internal circuit becomes different depending upon a CAS (column address strobe signal) latency which shows at what place of clocks counted from an command input clock an output synchronous clock is positioned. This CAS latency will be simply called a "CL" in this specification.

At present, for example, a synchronized dynamic RAM (random access memory), CL1 to CL4 are realized. Here, for simplification of description, a circuit construction having CL1 and CL2 will be described with reference to FIG. 1.

In an ordinary memory, an address (ADD) is supplied from an external to the memory, and data written in the address (ADD) is read out and outputted as an output data (DOUT). Therefore, the memory can be deemed as a linear circuit. However, when the memory is realized as a synchronized memory, latch circuits (LATCH) operated with different clocks $\phi1$ and $\phi2$ are provided in intermediate portions of the memory, as shown in FIG. 1, so that an overall memory circuit is divided into a first stage (1ST STAGE) and a second stage (2ND STAGE). In this case, the CAS latency can be changed depending upon how the clocks $\phi1$ and $\phi2$ are supplied.

For example, in order to realize the CAS latency=2 (CL2) in the synchronized memory shown in FIG. 1, it is sufficient if it is set to $\phi1=\phi2=ICLK$, where ICLK is an internal clock obtained by buffering an external CLK.

In this case ($\phi1=\phi2=ICLK$), an operation of the synchronized memory becomes as shown in a timing chart of FIG. 2. Namely, the first stage is controlled by a first external clock, and the second stage is controlled by a second external clock next to the first external clock. An access time tAC2 is controlled in the second stage, and therefore, is measured from the second external clock.

Assuming that a necessary time for an operation of the first stage is t1, and a necessary time for an operation of the second stage is t2, if t1>t2, a minimum cycle time tCK2mim required for this memory circuit is considered to be t1.

Next, in order to realize the CAS latency=1 (CL1) in the synchronized memory shown in FIG. 1, it is set to $\phi1=ICLK$ and $\phi2=ICLK1$, where ICLK1 is a delayed internal clock obtained by delaying the internal clock ICLK by a delay element DELAY as shown in FIG. 3.

In this case, it is sufficient if the delay amount for the delayed internal clock ICLK1 is set to be equal to the operation time t1 of the first stage. A timing chart of FIG. 4 illustrates an operation of the synchronized memory in this situation. In the case of the CAS latency=1, both of the first and second stages are controlled on the basis of the same external clock, and therefore, the access time tAC1 is measured from the first clock. In addition, a minimum cycle time tCK1mim required for this memory circuit is considered to be t1+t2.

As seen from the above, in the synchronized memory shown in FIG. 1, the CAS latency can be easily changed by changing the control clock $\phi2$ applied to the second stage.

In the above mentioned conventional circuit, in the case of the CAS latency=1, the control clock $\phi2$ applied to the second stage is generated by delaying the internal clock ICLK. Since the delay element is actually constituted of an even number (2N) of cascaded inverters as shown in FIG. 5, the delay amount greatly depends upon a transistor characteristics, namely, a manufacturing process condition.

If the delay amount changes because of variations in the manufacturing process with the result that the value set to be equal to the delay time t1 from the internal clock ICLK to the delayed internal clock ICLK1 as shown in FIG. 3 is elongated by $\Delta t$, the cycle time becomes as follows, as shown in FIG. 6.

tCK1min'=tCK1min+$\Delta t$

In addition, the access time becomes as follows:

tAC1'=tAC1+$\Delta t$

Namely, both of the cycle time and the access time are deteriorated by $\Delta t$. This means that the operation speed is deteriorated. In FIG. 6, the delayed internal clock "(ICLK1)" shown in a ghost line indicates the delayed internal clock having the designed delay value.

To the contrary, if the delay value is shortened by $\Delta t$, a difference between ICLK and ICLK1 becomes "t1–$\Delta t$". Since the necessary operation time of the first stage is t1, the first stage can no longer operate properly. This means a drop of a production yield.

As seen from the above, the process variation results in the drop of the production yield and the deterioration of the operation characteristics.

SUMMARY OF THE INVENTION

Accordingly, it is an object of the present invention to provide a controlled delay circuit for use in a synchronized semiconductor memory, which has overcome the above mentioned defects of the conventional one.

Another object of the present invention is to provide a controlled delay circuit for use in a synchronized semiconductor memory, which is not influenced by the variation of the delay amount caused by the manufacturing process variation.

Still another object of the present invention is to provide a controlled delay circuit for use in a synchronized semiconductor memory, which can always have a constant delay amount, without being influenced the manufacturing process variation, by automatically setting a delay amount to an optimum value.

The above and other objects of the present invention are achieved in accordance with the present invention by a controlled delay circuit for use in a synchronized semiconductor memory, comprising a reference delay, a delay circuit for controlling an internal circuit, and a comparing and adjusting means comparing a delay amount of the reference delay with a cycle of an external synchronous signal, for automatically adjusting a delay time of the delay circuit on the basis of the result of the comparison.

More specifically, there is provided a controlled delay circuit for use in a synchronized semiconductor memory, comprising in the same semiconductor device chip:

a delay circuit having an adjustable delay amount and receiving an internal synchronous signal for outputting a delayed internal synchronous signal;

a reference delay receiving an external synchronous signal for outputting a plurality of delayed signals having different delay times;

3 a comparing means receiving the external synchronous signal and the plurality of delayed signals for comparing each of the plurality of delayed signals with a transition edge of the external synchronous signal so as to determine a large-and-small relation between a designed delay value and an actual delay value; and an adjusting means for adjusting the adjustable delay amount of the delay circuit on the basis of the large-and-small relation between the designed delay value and the actual delay value given by the comparing means, so as to make an actual delay amount of the delayed internal synchronous signal near to a designed delay amount of the delayed internal synchronous signal.

The above and other objects, features and advantages of the present invention will be apparent from the following description of preferred embodiments of the invention with reference to the accompanying drawings.

4

DESCRIPTION OF THE PREFERRED EMBODIMENTS

Figure 1:
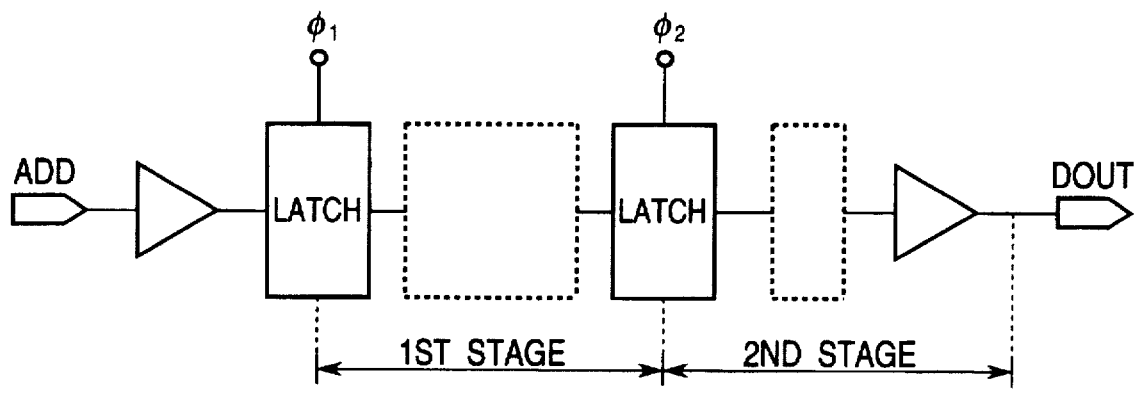
FIG. 1 is a block diagram of a basic circuit construction of a conventional synchronized semiconductor memory.
Figure 2:
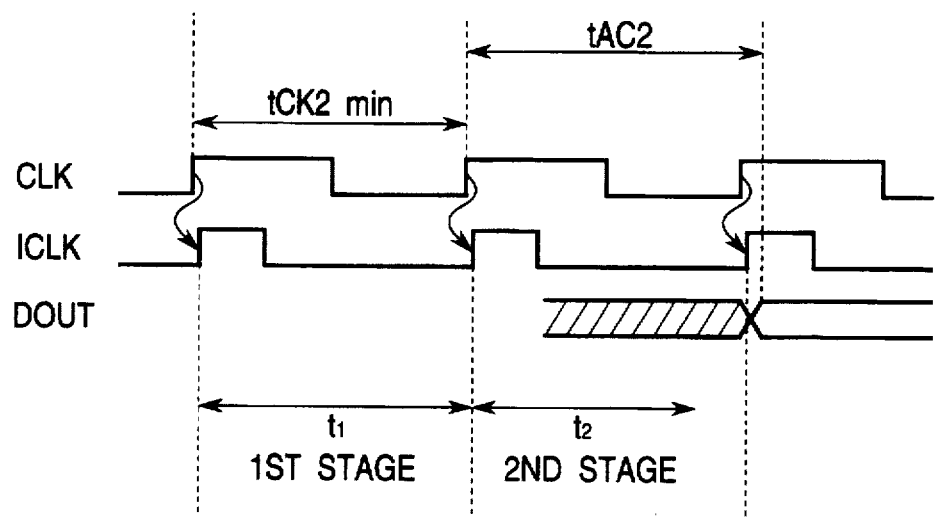
FIG. 2 is a timing chart illustrating an operation of the synchronized memory shown in FIG. 1 in the case of CAS latency=2.
Figure 3:
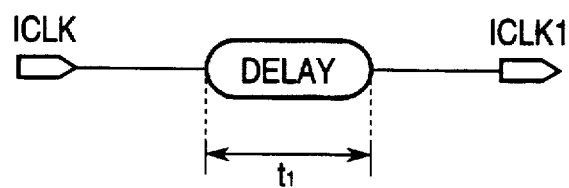
FIG. 3 symbolically illustrates a delay element used for generating a delayed internal clock.
Figure 4:
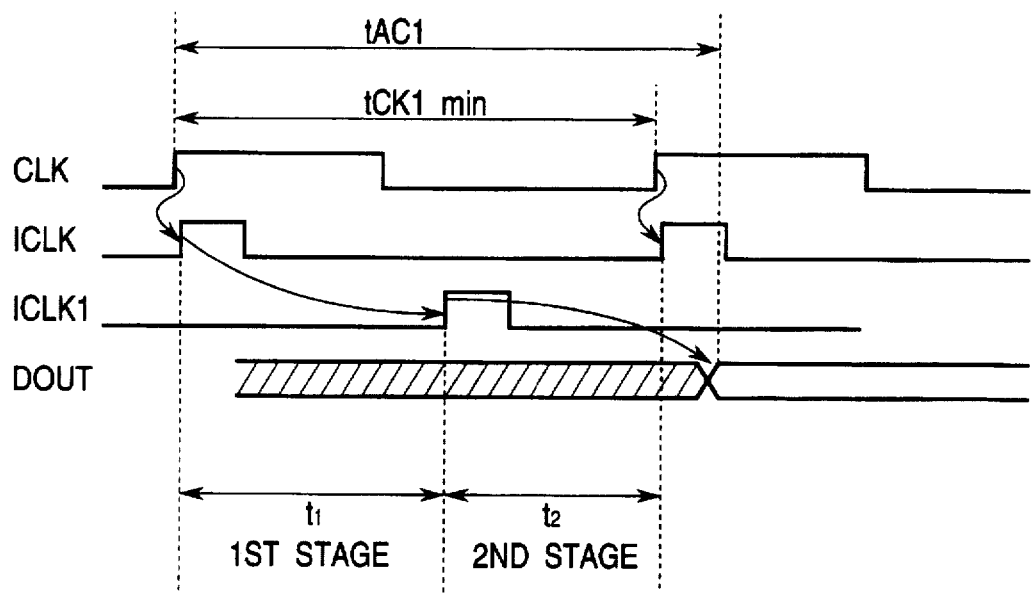
FIG. 4 is a timing chart illustrating an operation of the synchronized memory shown in FIG. 1 in the case of CAS latency=1.
Figure 5:
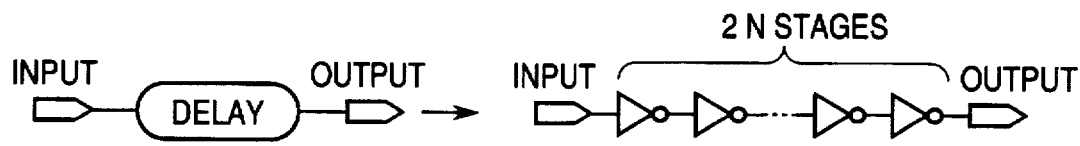
FIG. 5 is a circuit diagram illustrating an internal structure of the delay element shown in FIG. 3.
Figure 6:
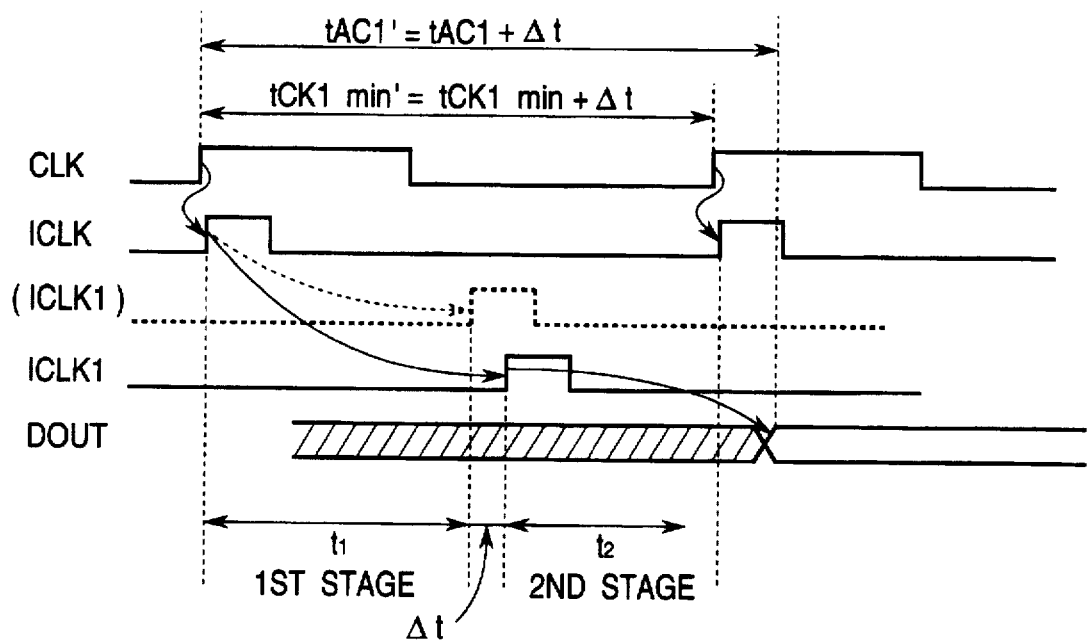
FIG. 6 is a timing chart illustrating an operation of the synchronized memory shown in FIG. 1 in the case of CAS latency=1 when the delay time of the delay element has become long.
Figure 7:
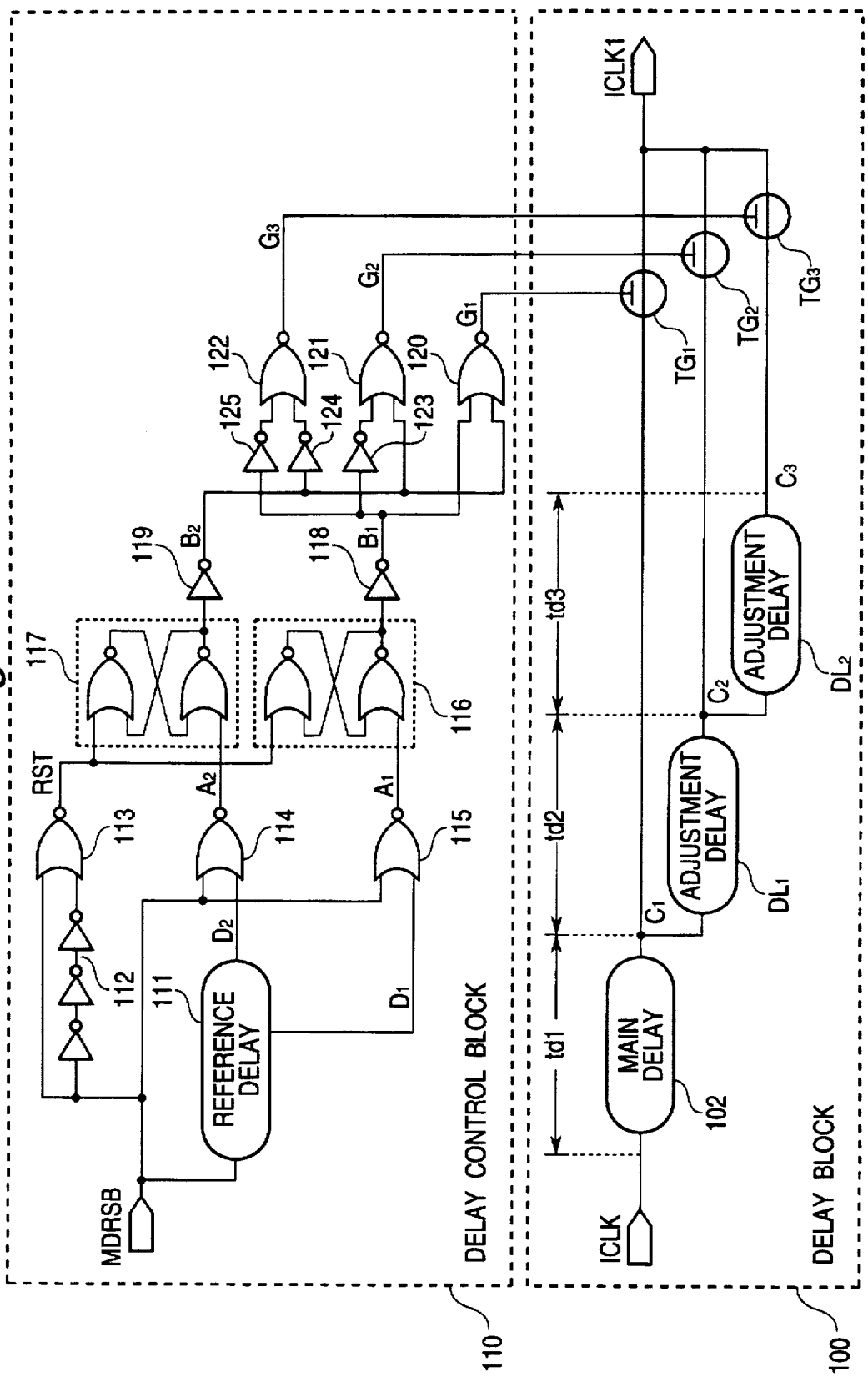
FIG. 7 is a circuit diagram of a first embodiment of the controlled delay circuit in accordance with the present invention for use in the synchronized semiconductor memory.

Referring to FIG. 7, there is shown a circuit diagram of a first embodiment of the controlled delay circuit in accordance with the present invention for use in the synchronized semiconductor memory.

The shown first embodiment generally includes a delay block 100 and a delay control block 110. The delay block 100 receiving an internal clock ICLK and outputting a delayed internal clock ICLK1, includes a main delay 102 having a delay time td1 and receiving the internal clock ICLK, a first adjustment delay DL1 having a delay time td2 and receiving an output C1 of the main delay 102, and a second adjustment delay DL2 having a delay time td3 and receiving an output C2 of the first adjustment delay DL1. Outputs C1, C2 and C3 of the delays 102, DL1 and DL2 are connected through transfer gates TG1, TG2 and TG3, respectively, to a common node for outputting the delayed internal clock ICLK1. These transfer gates TG1, TG2 and TG3 are controlled in such a manner that only one of the transfer gates TG1, TG2 and TG3 is turned on, so as to change the delay amount of the delayed internal clock ICLK1.

Figure 18:
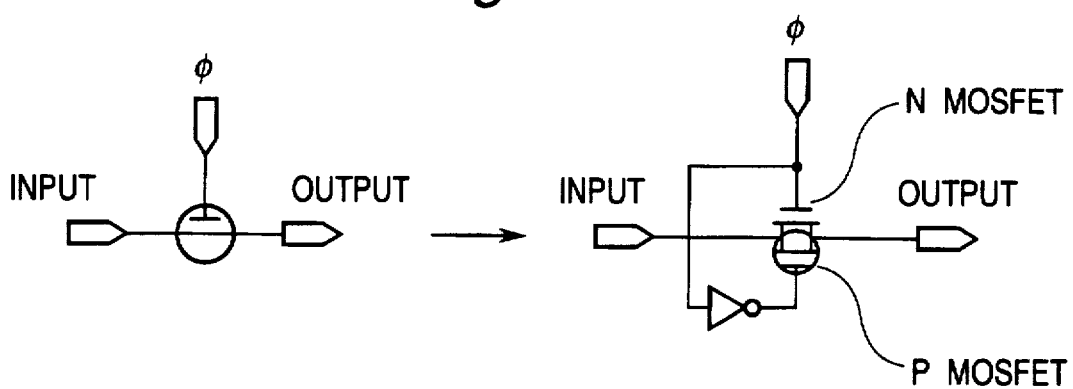
FIG. 18 illustrates an internal structure of a transfer gate.

As shown in FIG. 18, each of the transfer gates TG1, TG2 and TG3 is constituted of an N-channel MOSFET (metal-oxide-semiconductor field effect transistor) having a control gate connected to receive a control clock φ and a P-channel MOSFET connected in parallel to the N-channel MOSFET and having a control gate connected to receive through an inverter the control clock φ. Therefore, each of the transfer gates TG1, TG2 and TG3 is preferably constituted of a so-called CMOS transfer gate.

In a design stage, the delay amount of the delayed internal clock ICLK1 is set to be equal to "td1+td2" (=t1). In this case, the transfer gate TG2 is put in an on condition, and the transfer gates TG1 and TG3 are put in an off condition. Because of a manufacturing process variation, if an actual delay amount becomes longer than the designed value, the transfer gate TG1 is turned on and the transfer gate TG2 is turned off, so that the delay time td2 of the adjustment delay DL1 is removed. In this case, the delay amount of the delayed internal clock ICLK1 becomes "td1". On the other hand, if the actual delay amount becomes shorter than the designed value, the transfer gate TG3 is turned on and the transfer gate TG2 is turned off, so that the delay time td3 of the adjustment delay DL2 is added. In this case, the delay amount of the delayed internal clock ICLK1 becomes "td1+td2+td3".

The delay control block 110 is configured to receive an internal signal MDRSB and to control the transfer gates TG1, TG2 and TG3. The delay control block 110 includes a reference delay 111 receiving the internal signal MDRSB and having an intermediate node D1 for outputting a first delayed signal and an output node D2 for outputting a second delayed signal, and a NOR gate 113 having a first input directly receiving the internal signal MDRSB and a second input receiving through an odd number of cascaded inverters 112 the internal signal MDRSB, for generating a pulse signal RST.

The delay control block 110 also includes a NOR gate 114 having a first input first input directly receiving the internal signal MDRSB and a second input connected to the output node D2 of the reference delay 111, for generating a pulse signal A2, and a NOR gate 115 having a first input first input directly receiving the internal signal MDRSB and a second input connected to the intermediate node D1 of the reference delay 111, for generating a pulse signal A1. The pulse signal RST is supplied to a set input of each of two RS flipflops 116 and 117. The pulse signal A1 is supplied to a reset input of the RS flipflop 116, and the pulse signal A2 is supplied to a reset input of the RS flipflop 117.

An output of the RS flipflop 116 is connected to an inverter 118, which generates an output signal B1, and an output of the RS flipflop 117 is connected to an inverter 119, which generates an output signal B2. The output signals B1 and B2 are supplied directly to a NOR gate 120, which outputs a control signal G1 to a control gate of the transfer gate TG1.

The output signal B1 is supplied through an inverter 123 to a NOR gate 121, and the output signal B2 is supplied directly to the NOR gate 121. This NOR gate 121 outputs a control signal G2 to a control gate of the transfer gate TG2. The output signals B1 and B2 are supplied through inverters 125 and 124, respectively, to a NOR gate 122, which outputs a control signal G3 to a control gate of the transfer gate TG3.

Figure 8:
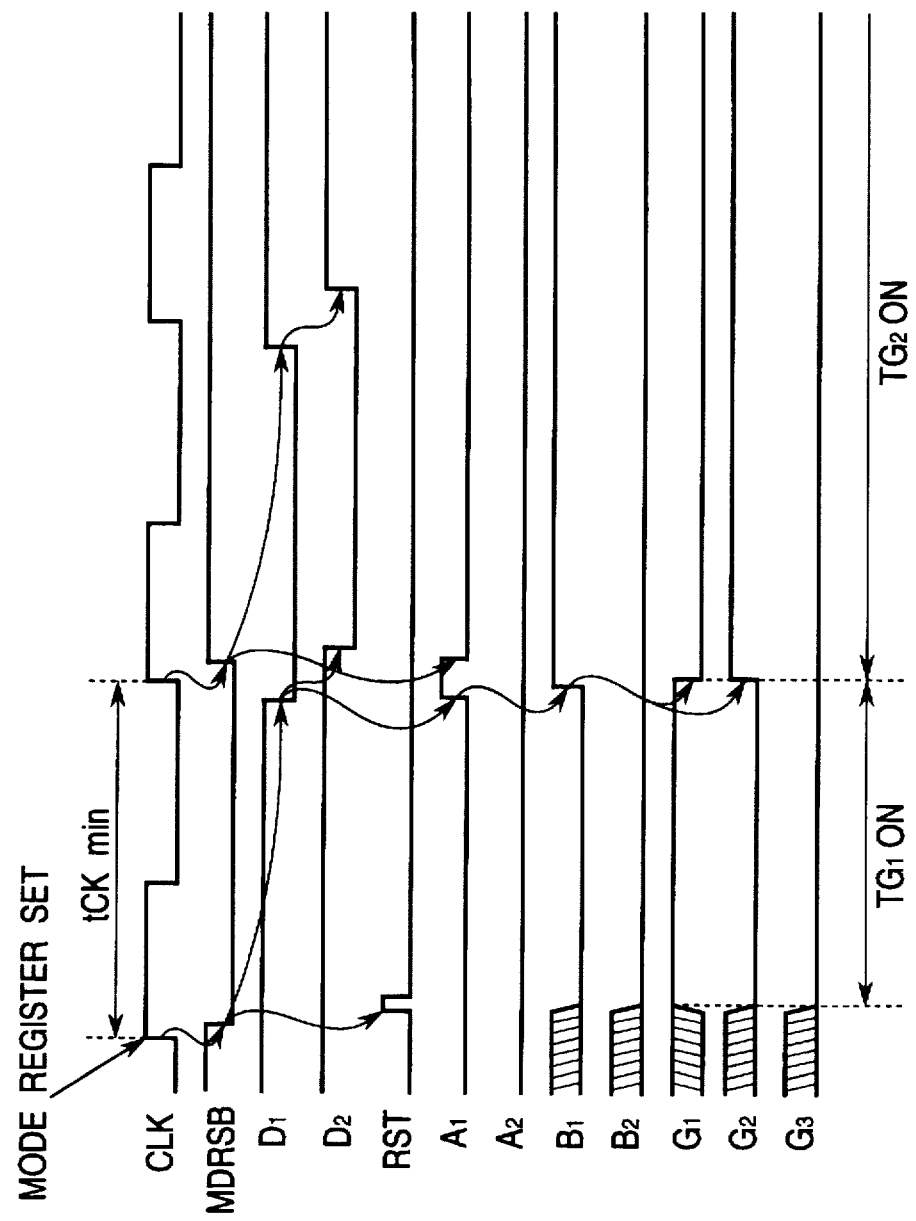
FIG. 8 is a timing chart illustrating an operation of the first embodiment shown in FIG. 7.

Now, operation of the delay control block 110 will be described with reference to FIG. 8, which is a timing chart illustrating an operation of the first embodiment shown in FIG. 7. In the synchronized semiconductor memory, before an actual operation, a mode register (not shown) must be set for determining in what mode the memory is operated. As shown in FIG. 8, if the mode register is set in synchronism to a first external clock CLK, the internal signal MDRSB is brought into a logical low level, to indicate, by a low active signal, that the mode register has been set. This internal signal MDRSB is reset to a logical high level in synchronism to a second external clock CLK. Namely, a low level period of the internal signal MDRSB becomes consistent with one cycle time tCK of the external clock CLK.

This internal signal MDRSB is supplied to the reference delay 111 whose delay amount is previously set to a minimum cycle time tCKmin.

The internal signal MDRSB delayed by the reference delay 111 is compared with the original internal signal MDRSB by the NOR gates 114 and 115. Here, since the reference delay 111 and the delays included in the delay block 100 for generating the delayed internal clock ICLK1 are formed in the same semiconductor chip, the delay amount of these delays vary by the same proportion because of a manufacturing process variation.

The internal signal MDRSB is also supplied directly and through the odd number of cascaded inverters 112 to the NOR gate 113. Therefore, in response to the falling edge of the internal signal MDRSB, the NOR gate 113 generates the pulse signal RST having a pulse width corresponding to a total delay time of the cascaded inverters 112. This pulse signal RST puts each of the RS flipflops 116 and 117 into a set condition. Namely, both the signals B1 and B2 are brought to the logical low level.

Figure 9:
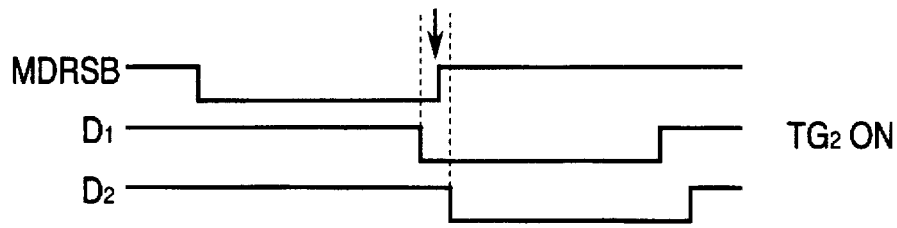
FIG. 9 is a timing chart illustrating a first operation condition of the first embodiment shown in FIG. 7.

If a rising edge of the internal signal MDRSB appears between a falling edge of the delayed signal outputted from the intermediate node D1 of the reference delay 111 and a falling edge of the delayed signal outputted from the output node D2 of the reference delay 111 as shown in FIGS. 8 and 9, this means that there is almost no process variation, and therefore, an actual delay value is substantially equal to the designed delay value. In this case, the NOR gate 115 generates a high level pulse signal A1 at the falling edge of the delayed signal outputted from the intermediate node D1 of the reference delay 111. This pulse signal A1 resets the RS flipflop 116, and therefore, the inverter 118 outputs the logical high level signal B1. On the other hand, the NOR gate 114 maintains its output signal A2 at the logical low level, and therefore, the inverter 119 maintains the logical low level signal B2. Thus, the output signal G2 is brought to the logical high level by the NOR gate 120, but the output signals G1 and G3 are brought to the logical low level. Accordingly, the transfer gate TG2 is put in an on condition, and the other transfer gates TG1 and TG3 are put in an off condition. Namely, the delay from ICLK to ICLK1 is as designed, as follows:

delay from ICLK to ICLK1=td1+td2

Figure 10:
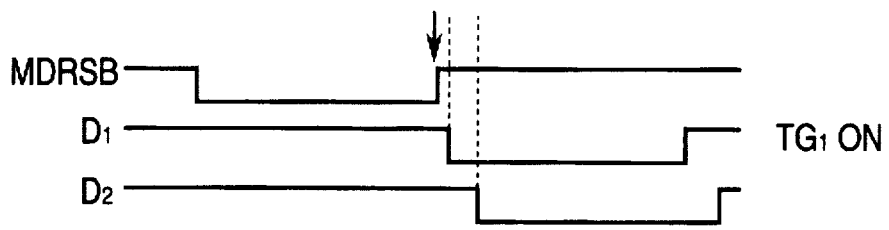
FIG. 10 is a timing chart illustrating a second operation condition of the first embodiment shown in FIG. 7.

If the falling edge of the delayed signal outputted from the intermediate node D1 of the reference delay 111 appears after the rising edge of the internal signal MDRSB as shown in FIG. 10, this means that the delay amount has varied to an increased value because of the process variation. Namely, the actual delay value is larger than the designed delay value. In this case, neither the NOR gate 114 nor the NOR gate 115 generates the pulse signal, so that both the signals B1 and B2 are maintained at the logical low level. Thus, the output signal G1 is brought to the logical high level, but the output signals G2 and G3 are brought to the logical low level. Accordingly, the transfer gate TG1 is put in an on condition, and the other transfer gates TG2 and TG3 are put in an off condition. Namely, the delay from ICLK to ICLK1 is adjusted and optimized by removing the delay td2 of the adjustment delay DL1 to cancel the delay amount increased by the process variation, as follows:

delay from ICLK to ICLK1=td1

Figure 11:
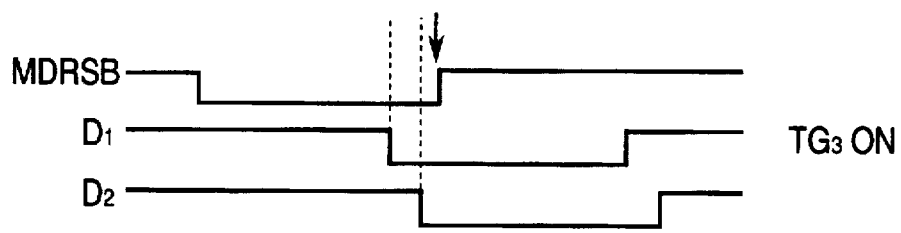
FIG. 11 is a timing chart illustrating a third operation condition of the first embodiment shown in FIG. 7.

If the falling edge of the delayed signal outputted from the output node D2 of the reference delay 111 appears before the rising edge of the internal signal MDRSB as shown in FIG. 11, this means that the delay amount has varied to a decreased value because of the process variation. Namely, the actual delay value is smaller than the designed delay value. In this case, both the NOR gate 114 and the NOR gate 115 generate the pulse signal, so that both the signals B1 and B2 are brought to the logical high level. Thus, the output signal G3 is brought to the logical high level, but the output signals G1 and G2 are brought to the logical low, level. Accordingly, the transfer gate TG3 is put in an on condition, and the other transfer gates TG1 and TG2 are put in an off condition. Namely, the delay from ICLK to ICLK1 is adjusted and optimized by adding the delay td3 of the adjustment delay DL2 to compensate for the delay amount decreased by the process variation, as follows:

delay from ICLK to ICLK1=td1+td2+td3

In the above mentioned first embodiment, the internal signal MDRSB can be deemed as a external synchronous signal, since the internal signal MDRSB transits its level in synchronism with the external clock signal. The NOR gates 114 and 115 constitute a comparing means for comparing each of a plurality of delayed signals D1 and D2 supplied from the reference delay 111, with a transition edge of the external synchronous signal, so as to determine a large-and-small relation between a designed delay value and an actual delay value. The delay control block 110 excluding the reference delay 111 and the NOR gates 114 and 115, constitutes an adjusting means for adjusting the adjustable delay amount (td1+td2+td3) of the delay block 110 on the basis of the large-and-small relation between the designed delay value and the actual delay value, so as to make an actual delay amount of the delayed internal synchronous signal ICLK1 near to a designed delay amount of the delayed internal synchronous signal.

Figure 12:
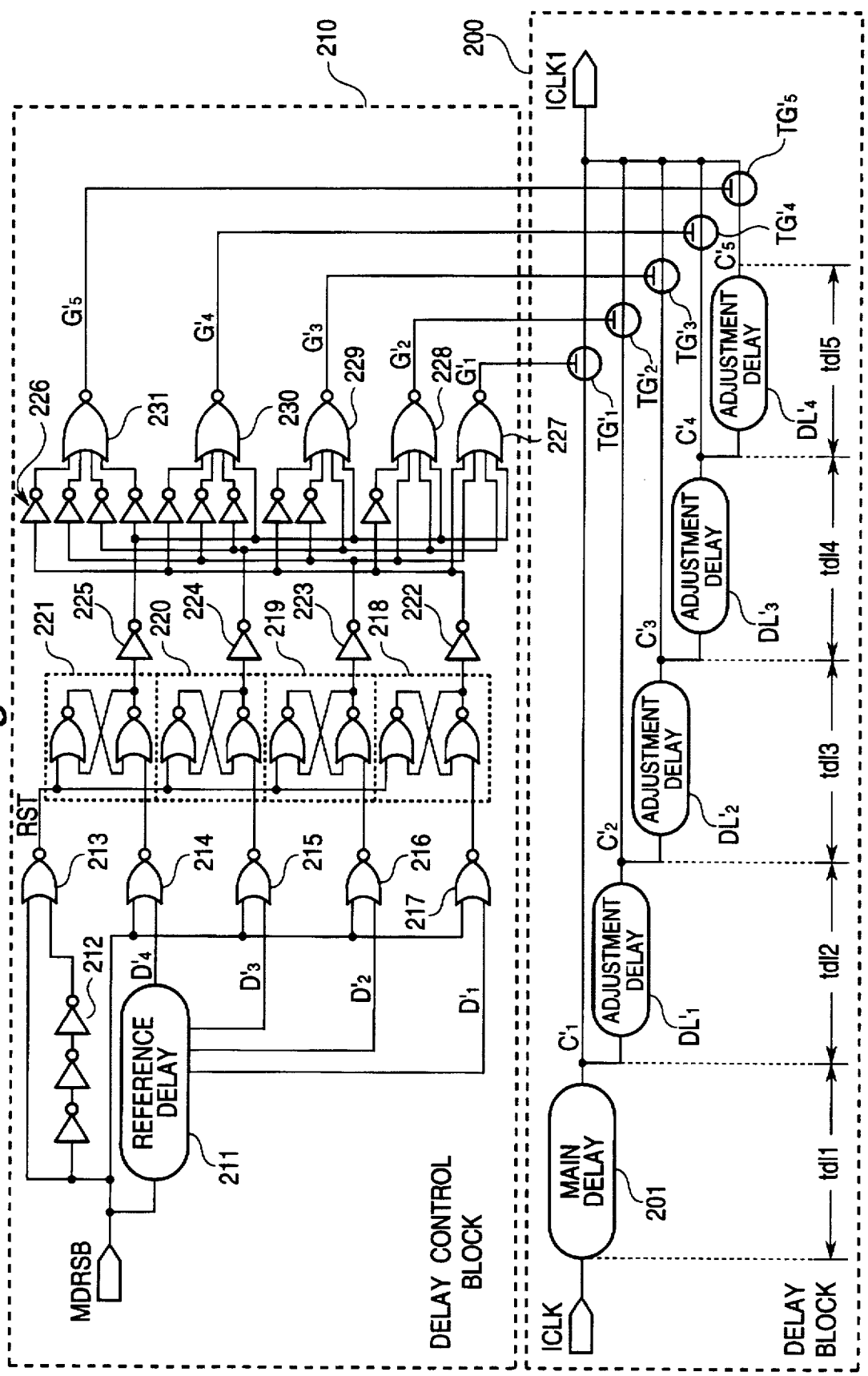
FIG. 12 is a circuit diagram of a second embodiment of the controlled delay circuit in accordance with the present invention for use in the synchronized semiconductor memory.

Referring to FIG. 12, there is shown a circuit diagram of a second embodiment of the controlled delay circuit in accordance with the present invention for use in the synchronized semiconductor memory.

The shown second embodiment generally includes a delay block 200 and a delay control block 210. The delay block 100 receiving an internal clock ICLK and outputting a delayed internal clock ICLK1, includes a main delay 201 having a delay time td11 and receiving the internal clock ICLK, a first adjustment delay DL'1 having a delay time td12 and receiving an output C'1 of the main delay 201, a second adjustment delay DL'2 having a delay time td13 and receiving an output C'2 of the first adjustment delay DL'1, a third adjustment delay DL'3 having a delay time td14 and receiving an an output C'3 of the second adjustment delay DL'2, and a fourth adjustment delay DL'4 having a delay time td15 and receiving an output C'4 of the third adjustment delay DL'4. Outputs C'1, C'2, C'3, C'4 and C'5 of the delays 201, DL'1, DL'2, DL'3 and DL'4 are connected through transfer gates TG'1, TG'2, TG'3, TG'4 and TG'5, respectively, to a common node for outputting the delayed internal clock ICLK1. These transfer gates TG'1, TG'2, TG'3, TG'4 and TG'5 are controlled in such a manner that only one of the transfer gates TG'1, TG'2, TG'3, TG'4 and TG'5 is turned on, so as to change the delay amount of the delayed internal clock ICLK1.

In a design stage, the delay amount of the delayed internal clock ICLK1 is set to be equal to "td11+td12+td13" (=t1). In this case, the transfer gate TG'3 is put in an on condition, and the transfer gates TG'1, TG'2, TG'4 and TG'5 are put in an off condition.

The delay control block 210 is configured to receive an internal signal MDRSB and to control the transfer gates TG'1, TG'2, TG'3, TG'4 and TG'5. The delay control block 110 includes a reference delay 211 receiving the internal signal MDRSB and having a first intermediate node D'1 for outputting a first delayed signal, a second intermediate node D'2 for outputting a second delayed signal, a third intermediate node D'3 for outputting a third delayed signal, and an output node D'4 for outputting a fourth delayed signal, and a NOR gate 213 having a first input directly receiving the internal signal MDRSB and a second input receiving through an odd number of cascaded inverters 212 the internal signal MDRSB, for generating a pulse signal RST.

The delay control block 210 also includes four NOR gates 214, 215, 216 and 217 each having a first input first input directly receiving the internal signal MDRSB and a second input connected to a corresponding one of the intermediate and output nodes D'1, D'2, D'3 and D'4 of the reference delay 211. The pulse signal RST is supplied to a set input of each of four RS flipflops 218, 219, 220 and 221. A reset input of each of the RS flipflops 218, 219, 220 and 221 is connected to an output of a corresponding one of the four NOR gates 214, 215, 216 and 217. An output of the RS flipflops 218, 219, 220 and 221 are connected through inverters 222, 223, 224 and 225, respectively, to a logic circuitry composed of five inverters 226 and five NOR gates 227, 228, 229, 230 and 231 connected as shown. The NOR gate 227 outputs a control signal G'1 to a control gate of the transfer gate TG'1. The NOR gate 228 outputs a control signal G'2 to a control gate of the transfer gate TG'2. The NOR gate 229 outputs a control signal G'3 to a control gate of the transfer gate TG'3. The NOR gate 230 outputs a control signal G'4 to a control gate of the transfer gate TG'4. The NOR gate 231 outputs a control signal G'5 to a control gate of the transfer gate TG'5.

The delay control block 210 includes the reference delay 211 having the three intermediate nodes and the one output node, but is constructed on the same design conception as that of the delay control block 110 of the first embodiment. Therefore, since a construction and an operation of the delay control block 210 would be sufficiently understood from FIG. 12, a further description will be omitted.

Now, operation of the second embodiment will be described with reference to FIGS. 13 to 17, which are timing charts illustrating different operation conditions of the second embodiment shown in FIG. 12.

Figure 13:
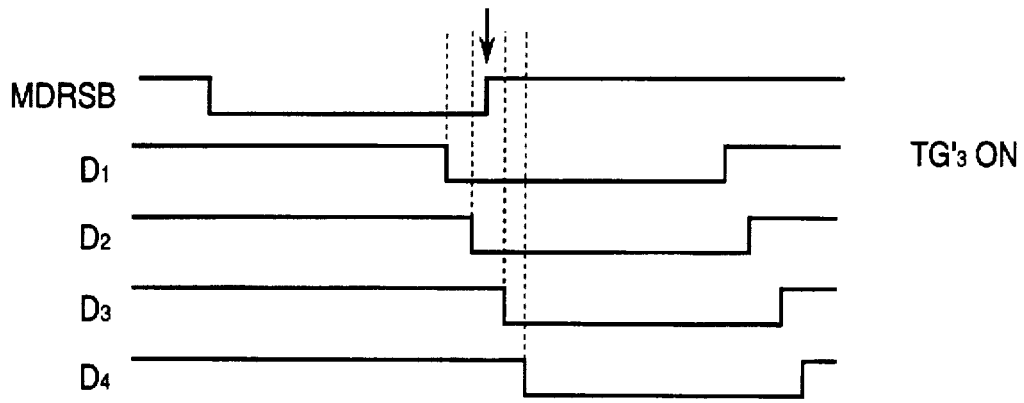
FIG. 13 is a timing chart illustrating a first operation condition of the second embodiment shown in FIG. 12.

FIG. 13 illustrates that a rising edge of the internal signal MDRSB appears between a falling edge of the delayed signal outputted from the intermediate node D'2 of the reference delay 211 and a falling edge of the delayed signal outputted from the intermediate node D'3 of the reference delay 211. This means that there is almost no process variation, and an actual delay value is substantially equal to the designed delay value. In this case, the transfer gate TG'3 is put in an on condition, and the other transfer gates TG'1, TG'2, TG'4 and TG'5 are put in an off condition. Namely, the delay from ICLK to ICLK1 is as designed, as follows:

delay from ICLK to ICLK1=td11+td12+td13

Figure 14:
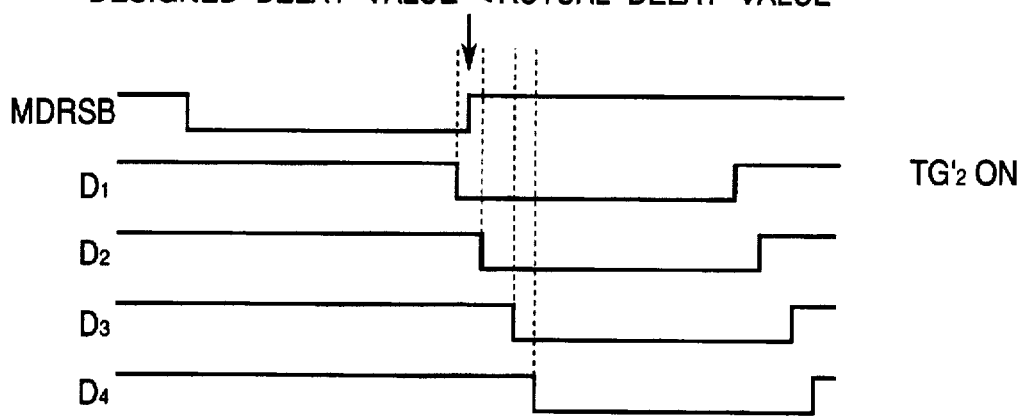
FIG. 14 is a timing chart illustrating a second operation condition of the second embodiment shown in FIG. 12.

FIG. 14 illustrates that the rising edge of the internal signal MDRSB appears between a falling edge of the delayed signal outputted from the intermediate node D'1 of the reference delay 211 and the falling edge of the delayed signal outputted from the intermediate node D'2 of the reference delay 211. This means that the designed delay value is less than the actual delay value. In this case, the transfer gate TG'2 is put in an on condition, and the other transfer gates TG'1, TG'3, TG'4 and TG'5 are put in an off condition. Namely, the delay from ICLK to ICLK1 is adjusted and optimized by removing the delay td13 of the adjustment delay DL'2 to cancel the delay amount increased by the process variation, as follows:

delay from ICLK to ICLK1=td11+td12

Figure 15:
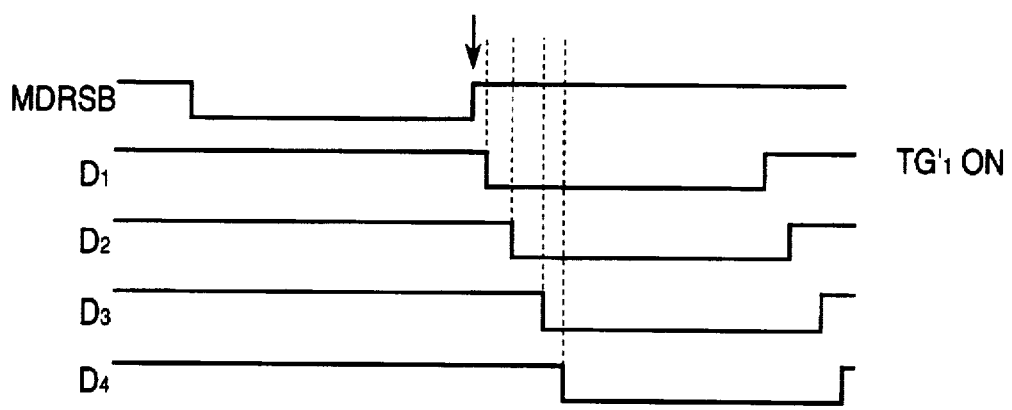
FIG. 15 is a timing chart illustrating a third operation condition of the second embodiment shown in FIG. 12.

FIG. 15 illustrates that the rising edge of the internal signal MDRSB appears before the falling edge of the delayed signal outputted from the intermediate node D'1 of the reference delay 211. This means that the designed delay value is much less than the actual delay value. In this case, the transfer gate TG'1 is put in an on condition, and the other transfer gates TG'2, TG'3, TG'4 and TG'5 are put in an off condition. Namely, the delay from ICLK to ICLK1 is adjusted and optimized by removing the delay td12 of the adjustment delay DL'1 and the delay td13 of the adjustment delay DL'2 to cancel the delay amount much increased by the process variation, as follows:

delay from ICLK to ICLK1=td11

Figure 16:
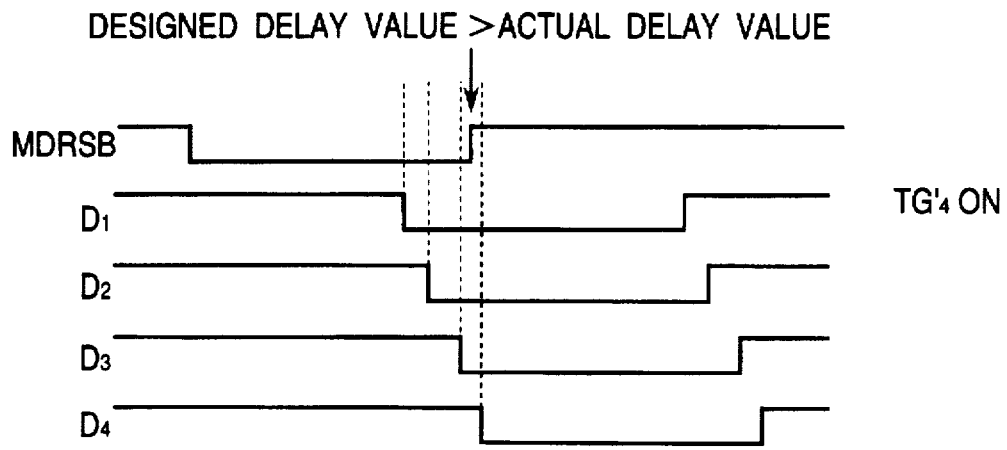
FIG. 16 is a timing chart illustrating a fourth operation condition of the second embodiment shown in FIG. 12.

FIG. 16 illustrates that the rising edge of the internal signal MDRSB appears between the falling edge of the delayed signal outputted from the intermediate node D'3 of the reference delay 211 and a falling edge of the delayed signal outputted from the output node D'4 of the reference delay 211. This means that the designed delay value is greater than the actual delay value. In this case, the transfer gate TG'4 is put in an on condition, and the other transfer gates TG'1, TG'2, TG'3 and TG'5 are put in an off condition. Namely, the delay from ICLK to ICLK1 is adjusted and optimized by adding the delay td14 of the adjustment delay DL'3 to compensate for the delay amount decreased by the process variation, as follows:

delay from ICLK to ICLK1=td11+td12+td13+td14

Figure 17:
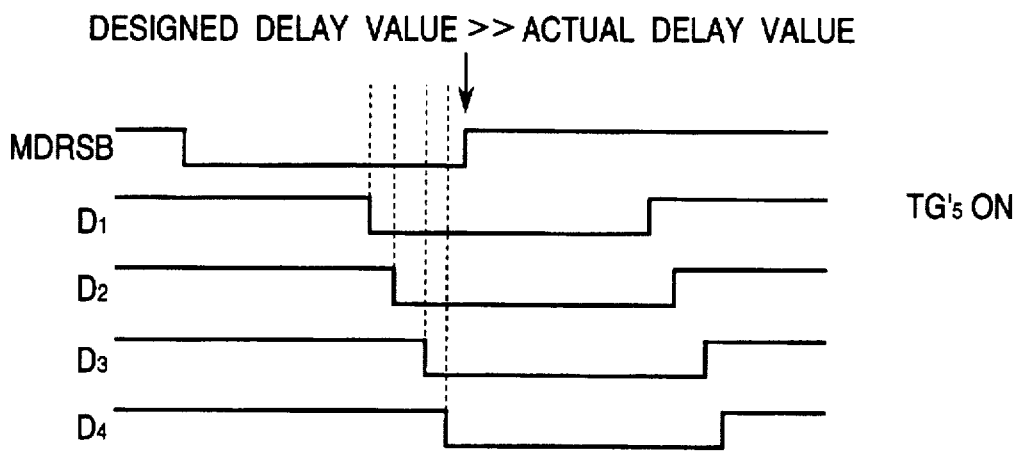
FIG. 17 is a timing chart illustrating a fifth operation condition of the second embodiment shown in FIG. 12.

FIG. 17 illustrates that the rising edge of the internal signal MDRSB appears after a falling edge of the delayed signal outputted from the output node D'4 of the reference delay 211. This means that the designed delay value is much greater than the actual delay value. In this case, the transfer gate TG'5 is put in an on condition, and the other transfer gates TG'1, TG'2, TG'3 and TG'4 are put in an off condition. Namely, the delay from ICLK to ICLK1 is adjusted and optimized by adding the delay td14 of the adjustment delay DL'3 and the delay td15 of the adjustment delay DL'4 to compensate for the delay amount much decreased by the process variation, as follows:

delay from ICLK to ICLK1=td11+td12+td13+td14+td15

As seen from the above, the second embodiment can much finely adjust the delay amount as compared with the first embodiment.

Thus, although the delay amount of the delay circuit has changed because of a manufacturing process variation, the controlled delay circuit in accordance with the present invention for use in the synchronized semiconductor memory can automatically optimize the delay amount of the delay circuit by using a cycle of an external clock as a reference at the time of setting the mode register Thus, the delay amount of the delay circuit can be maintained always at a constant value, independently of the manufacturing process variation. Accordingly, the devices can be manufactured stably with a high production yield.

The invention has thus been shown and described with reference to the specific embodiments. However, it should be noted that the present invention is in no way limited to the details of the illustrated structures but changes and modifications may be made within the scope of the appended claims.

I claim:

1. A controlled delay circuit for use in a synchronized semiconductor memory, comprising a reference delay, a delay circuit for controlling an internal circuit, and a comparing and adjusting means comparing a delay amount of said reference delay with a cycle of an external synchronous signal, for automatically adjusting a delay time of said delay circuit on the basis of the result of the comparison.

2. A controlled delay circuit claimed in claim 1 wherein said comparing and adjusting means is configured to automatically compare the delay amount of said reference delay with the cycle of said external synchronous signal, at a mode register setting time.

3. A controlled delay circuit for use in a synchronized semiconductor memory, comprising in the same semiconductor device chip:

a delay circuit having an adjustable delay amount and receiving an internal synchronous signal for outputting a delayed internal synchronous signal;

a reference delay receiving an external synchronous signal for outputting a plurality of delayed signals having different delay times;

a comparing means receiving said external synchronous signal and said plurality of delayed signals for comparing each of said plurality of delayed signals with a transition edge of said external synchronous signal so as to determine a large-and-small relation between a designed delay value and an actual delay value; and an adjusting means for adjusting said adjustable delay amount of said delay circuit on the basis of said large-and-small relation between the designed delay value and the actual delay value given by said comparing means, so as to make an actual delay amount of said delayed internal synchronous signal near to a designed delay amount of said delayed internal synchronous signal.

4. A controlled delay circuit claimed in claim 3 wherein said reference delay is so configured that one of said plurality of delayed signals has a delay time equal to a minimum cycle time.

* * * * *